United States Patent [19]

Ishii et al.

[11] Patent Number: 4,647,870

[45] Date of Patent: Mar. 3, 1987

[54] CURRENT MIRROR CIRCUIT WITH A LARGE CURRENT RATIO

[75] Inventors: Eiichi Ishii; Takakazu Yoshioka, both of Tokyo, Japan

[73] Assignee: NEC Corporation, Tokyo, Japan

[21] Appl. No.: 594,818

[22] Filed: Mar. 29, 1984

[30] Foreign Application Priority Data

Mar. 30, 1983 [JP] Japan .................................. 58-54113
Mar. 30, 1983 [JP] Japan .................................. 58-54115

[51] Int. Cl.[4] ............................................... H03F 3/04
[52] U.S. Cl. ..................................... 330/288; 323/315
[58] Field of Search ............................... 330/257, 288; 323/315–317

[56] References Cited

U.S. PATENT DOCUMENTS 3,952,257 4/1976 Schade, Jr. .......................... 330/288
4,140,977 2/1979 Ahmed ............................... 330/288
4,408,190 10/1983 Nagano ........................... 330/257 X

FOREIGN PATENT DOCUMENTS 2086682 5/1982 United Kingdom ................ 330/288

*Primary Examiner*—James B. Mullins
*Attorney, Agent, or Firm*—Burns, Doane, Swecker & Mathis

[57] ABSTRACT

A transistor is connected to form a diode and connected with another transistor so that the base and the emitter is connected to the base and the emitter of the other transistor, respectively, thereby to constitute a partial current mirror. A plurality of the partial current mirrors thus constituted are serially connected between an input terminal and a reference terminal, and an output terminal is connected to the collector of a partial current mirror which is directly connected to the reference terminal. Transistors of the same polarity are used to obtain an output current larger than an input current. On the contrary, to obtain an output current smaller than an input current, the transistors constituting the partial current mirror directly connected to the reference terminal are made to have the opposite polarity to the transistors constituting other partial current mirrors.

2 Claims, 7 Drawing Figures

CURRENT MIRROR CIRCUIT WITH A LARGE CURRENT RATIO

BACKGROUND OF THE INVENTION

1. Field of the Invention:

This invention relates to a current mirror circuit with a large input/output current ratio, and more particularly, to a circuit configuration of the current mirror circuit suitable to be formed in a semiconductor integrated circuit.

2. Description of the Prior Art:

Since transistors of the same characteristics can be easily combined in the semiconductor integrated circuit, the transistors of the same characteristics are used to provide a current mirror circuit having a strictly controlled input/output current ratio. The input/output current ratio may be controlled by emitter areas of the transistors used in the current mirror circuit.

Such a conventional current mirror circuit is shown in FIG. 1. There are used two NPN transistors 1 and 2 which have an emitter area ratio of 1:N. The emitters of these transistors 1 and 2 are grounded together. The bases of both transistors 1 and 2 are commonly connected to each other. The collector of the transistor 1 is connected to the common joint of the bases to operate as a diode. The collector/base short-circuited point of the transistor 1 is connected to an input terminal 3, and the collector of the transistor 2 is connected to an output terminal 4.

The transistors 1 and 2 are formed on a single semiconductor chip through the same diffusion process and have the same parameters other than the planar area. More specifically, the base, collector and emitter regions of the transistors 1 and 2 have the same values in their parameters such as a depth, impurity density, etc. From this reason, the current densities of the transistors 1 and 2 become equal to each other. Therefore, the currents flowing through the transistors 1 and 2 have a proportional relationship with the emitter areas thereof as represented by the following equation:

$$I_2/I_1 = A_{E2}/AE_1 = N \quad (1)$$

where $I_1$: current flowing through the transistor 1

$I_2$: current flowing through the transistor 2

$A_{E1}$: emitter area of the transistor 1

$A_{E2}$: emitter area of the transistor 2

N: emitter area ratio between the transistors 1 and 2.

In this way, an output current proportional to an input current can be obtained. By setting the value of a proportional constant N, i.e. the emitter area ratio, in the equation (1) larger than 1, a current mirror circuit can be also realized which produces a larger output current than an input current.

However, when taking out an output current 100 times larger than an input current for example, the circuit of FIG. 1 requires to broaden the emitter area of the transistor 2 about 100 times larger than that of the transistor 1. This results in such a defect that the area of the transistor 2 becomes very large and the area of a chip necessary for the semiconductor integrated circuit is increased accordingly with an adverse effect of the higher manufacturing cost. Moreover, since the broadened area of the transistor 2 causes a temperature gradient within its emitter area, the transistors 1 and 2 lose the coincidence in their electrical characteristics, whereby it becomes impossible to obtain an output current stably proportional to an input current.

The current mirror circuit of FIG. 1 can also provide an output current smaller than an input current at a predetermined ratio. In this case, the proportional constant N in the equation (1) is set below one. However, when taking out an output current reduced at a very small value, for example 1/50, the emitter area of the transistor 2 must be made very small. But, too small sized transistor is sensitive to fluctuation of manufacturing condition. Therefore, to obtain controlled characteristics there is a limitation on the minimum size of transistors arrayed in the semiconductor integrated circuit. From this reason, when the emitter area of the transistor 2 is set at the minimum limit size, the transistor 1 requires the very large emitter area. This causes a similar defect to that in the above case where an output current is made very large.

A current mirror circuit adapted to make small an output current as shown in FIG. 2 has been proposed in Japanese Patent Application Un-Examined Publication No. 57-723. In this circuit, the emitter of a transistor 11 whose base and collector are connected to form a diode and the emitter of a transistor 12 are commonly connected to the joint between the collector and the base of a transistor 15 which is also connected to form a diode. The base of a transistor 16 is connected to the common joint between the collector and the base of the transistor 15. The base of the transistor 12 is connected to the common joint between the collector and the base of the transistor 11. An input terminal 13 is connected to the collectors of the transistors 11 and 16, while an output terminal 14 is connected to the collector of the transistor 12. The emitters of the transistors 15 and 16 are commonly grounded together.

Since the conventional circuit shown in FIG. 2 is fabricated in a semiconductor integrated circuit similarly to that shown in FIG. 1, the transistors 11 and 12 are matching with each other in the point of electrical characteristics, and likewise the transistors 15 and 16 are matching with each other in the point of electrical characteristics. Assuming now that the ratio of emitter area of the transistor 11 to emitter area of the transistor 12 is K and the ratio of emitter area of the transistor 16 to emitter area of the transistor 15 is L, the relationship of currents passing through the respective transistors 11, 12, 15 and 16 are represented as follows:

$$I_{OUT}/I_{11} = 1/K \quad (2)$$

$$I_{15} = I_{OUT} + I_{11} = (1+K)I_{OUT} \quad (3)$$

$$I_{16} = L \cdot L_{15} = (L + L \cdot K)I_{OUT} \quad (4)$$

$$I_{IN} = I_{11} + I_{16} = (K + L + L \cdot K)I_{OUT} \quad (5)$$

$$I_{OUT}/I_{IN} = 1/k + L + L \cdot K \quad (6)$$

where $I_{OUT}$: output current taken out from the output terminal 14

$I_{11}$: current flowing through the transistor 11

$I_{15}$: current flowing through the transistor 15

$I_{16}$: current flowing through the transistor 16

$I_{IN}$: input current flowing into the input terminal 13

Thus, the current mirror circuit shown in FIG. 2 and fabricated in a semiconductor integrated circuit permits to take out an output current $I_{OUT}$ reduced proportional to the ratio of 1/(K+L+L.K) relative to an input current $I_{IN}$ flowing into the input terminal 13. Further, the circuit of FIG. 2 requires the much smaller area for the transistors 11, 12, 15 and 16 as compared with the current mirror circuit shown in FIG. 1, so that the foregoing defect in the prior art is improved to a certain extent.

However, there were accompanied with such a defect as follows, because the emitter of the transistor 12 is not directly grounded, but grounded through the transistor 15.

That is, in the conventional circuit as shown in FIG. 1, the emitter of the transistor 2 is directly grounded, whereby the circuit can operate normally with the voltage applied to the output terminal 4 above ca. 0.3 V. To the contrary, the conventional circuit as shown in FIG. 2 can not operate normally unless the voltage applied to the output terminal 14 exceeds 1.0 V. In other words, a load which lowers the voltage at the output terminal 14 below 1.0 V cannot be connected to the output terminal 14. Thus, loads applicable to the current mirror circuit as shown in FIG. 2 are limited.

SUMMARY OF THE INVENTION

It is an object of the present invention to provide a current mirror circuit which requires the smaller occupied area on a semiconductor chip, which allows the smaller potential difference needed between an output terminal and the reference potential, and which can afford a large input/output current ratio.

According to the present invention, there is provided a current mirror circuit comprising; a first group of a plurality of transistors with their collector-emitter paths serially connected between a reference potential point and an input terminal, each of the plural transistors having the base and collector commonly connected to each other, and a first transistor among the first group of plural transistors having the emitter connected to the reference potential point; a second group of a plurality of transistors each having the base and emitter respectively connected to the base and the emitter of each corresponding transistor in the first group; and an output terminal connected to the collector of a transistor among the second group of plural transistors having the base and the emitter respectively connected to the base and the emitter of the first transistor in the first group.

According to the present invention, each transistor in the first group and the corresponding transistor in the second group constitute a partial current mirror. An input current is first increased or decreased at a predetermined rate through the partial current mirror locating nearest to the input terminal, and then increased or decreased again at a predetermined rate through the next partial current mirror on the downstream side. Thus, the resulting input/output current ratio is given by multiplication of current ratios of the respective partial current mirrors, thereby providing a very large input/output current ratio. In this connection, the total emitter area of the transistors can be greatly reduced as compared with that of the transistors in the case of constituting the current mirror circuit by a single partial current mirror. As a result, it becomes possible to make smaller the occupied area on a semiconductor chip and lower the manufacturing cost of a semiconductor integrated circuit. Also, since each transistor requires the smaller occupation area, it will not undergo influence of the temperature distribution. This permits to attain a predetermined input/output current ratio with stability. Moreover, since there exists only one collector-emitter path of a single transistor between the reference potential point and the output terminal, the potential difference required between them is just the collector-emitter saturated voltage of a single transistor, and hence it becomes very small.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 3:
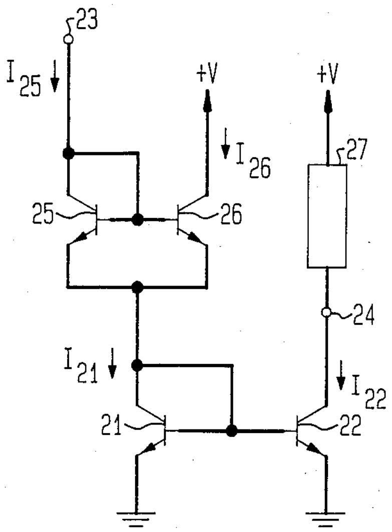
FIG. 3 is a circuit diagram of a current mirror circuit according to a first embodiment of the present invention.

According to a first embodiment of the present invention as shown in FIG. 3, a first partial current mirror comprises NPN transistors 21 and 22, and a second partial current mirror comprises NPN transistors 25 and 26. The emitters of both transistors 21 and 22 are grounded, while the bases of both transistors 21 and 22 are commonly connected to each other. The collector of the transistor 21 is connected to its base so as to form a diode. The collector of the transistor 22 is connected to an output terminal 24. The emitters of both transistors 25 and 26 are connected together to the collector-base joint of the transistor 21. The bases of both transistors 25 and 26 are also commonly connected to each other. The collector of the transistor 25 is connected to its base so as to form a diode and also connected to an input terminal 23. The collector of the transistor 26 is connected to an adequate potential point, e.g., a voltage source terminal +V. The transistors 25 and 26 constitute another partial current mirror. A load 27 is connected between the output terminal 24 and the power source terminal +V to constitute an electronic circuit together with the current mirror circuit comprising the transistors 21, 22, 25 and 26.

The collector, base and emitter regions of the respective transistors 21, 22, 25 and 26 are formed to have the same depths and the same impurity densities. Only the planar area is made different from each other for the respective pairs of transistors. Thus, the transistors 21 and 22 have the equal emitter current density, and the transistors 25 and 26 have the equal emitter current density. Herein, the emitter area of each transistor serves as a factor for determining an input/output current ratio. More specifically, an input/output current ratio of the partial current mirror comprising the transistors 21 and 22 is determined by an emitter area ratio between those transistors 21 and 22. This emitter area ratio is assumed as $N_1$. In a similar way, an input/output ratio of the partial current mirror comprising the transistors 25 and 26 is determined by an emitter area ratio between those transistors 25 and 26. This emitter area ratio is assumed as $N_2$. On this occassion, the relationships between currents flowing through the transistors 21, 22, 25 and 26 and the emitter areas thereof are represented by the equations as below:

$$I_{22}/I_{21}=A_{E22}/A_{E21}=N_1 \quad (7)$$

$$I_{26}/I_{25}=A_{E26}/A_{E25}=N_2 \quad (8)$$

where $I_{21}$: current flowing through the transistor 21
$I_{22}$: current flowing through the transistor 22
$I_{25}$: current flowing through the transistor 25
$I_{26}$: current flowing through the transistor 26
$A_{E21}$: emitter area of the transistor 21
$A_{E22}$: emitter area of the transistor 22
$A_{E25}$: emitter area of the transistor 25
$A_{E26}$: emitter area of the transistor 26 and $$I_{21}=I_{25}+I_{26}=(1+N_1)\cdot I_{25} \quad (9)$$

Therefore, the relationship between the input current $I_{25}$ and the output current $I_{22}$ of the current mirror circuit is given by:

$$I_{22}/I_{25}=(1+N_2)\cdot N_1 \quad (10)$$

Thus, the output current of the current mirror circuit is proportional to the input current thereof. For example, it is assumed that the emitter area of the transistor 22 is set 10 times larger than that of the transistor 21 and the emitter area of the transistor 26 is set 9 times larger than that of the transistor 25. That is:

$$N_1=10 \quad (11)$$

$$N_2=9 \quad (12)$$

By substituting both equations (6) and (7) into the equation (5):

$$I_{22}/I_{25}=100 \quad (13)$$

Thus, it is possible to take out the output current 100 times larger than the input current.

Figure 1:
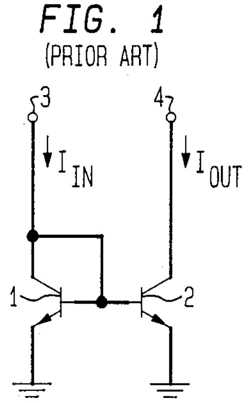
FIG. 1 (PRIOR ART)
FIG. 1 is a circuit diagram of a current mirror circuit in the prior art.
Figure 2:
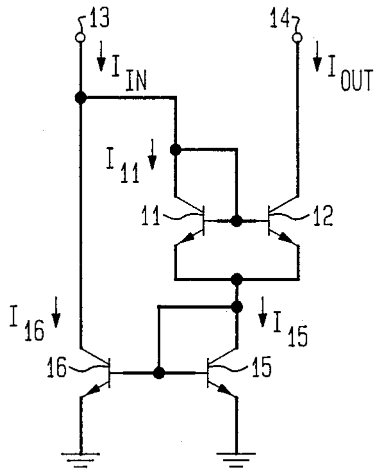
FIG. 2 (PRIOR ART)
FIG. 2 is a circuit diagram of another current mirror circuit in the prior art.

In this connection, according to the conventional circuit as shown in FIG. 1, the transistor 2 required the emitter area 1000 times larger than that of the transistor 1, so that the emitter area as large as 101 times of the emitter area of the transistor 1 was required to provide the total emitter area of both transistors 1 and 2. On the other hand, according to the first embodiment of the present invention, the transistor 22 requires the emitter area 10 times that of the transistor 21 and the transistor 26 requires the emitter area 9 times that of the transistor 25, so that the emitter area as large as only 21 times of the emitter area of the transistor 21 or 25 is required to provide the total emitter area of all transistors 21, 22, 25 and 26 by assuming the emitter areas of the transistors 21 and 25 to be equal to each other.

Differently stated, the present invention can make it possible to realize a current mirror circuit with the emitter area much smaller than that of the conventional current mirror circuit, i.e., the smaller semiconductor chip area. Further, each transistor requires the not so large emitter area and hence the temperature gradient occurred in the transistor is restricted within a small extent, whereby an influence on the electrical characteristics due to the temperature gradient becomes very small. Thus, there is attained such an advantage that an output current accurately proportional to an input current can be taken out with high stability. Moreover, only one collector-emitter path of the transistor 22 is present between the reference potential point or a grounded potential point and the output terminal 24. Accordingly, the potential difference between the reference potential point and the output terminal 24 required for normally operating the current mirror circuit is just the collector-emitter saturated voltage of the transistor 22. This collector-emitter saturated voltage is very small as much as 0.3 V. As a consequence, less limitation arises on a load circuit to be connected to the output terminal 24 and the resultant current mirror circuit is widely applicable to various circuit.

Figure 4:
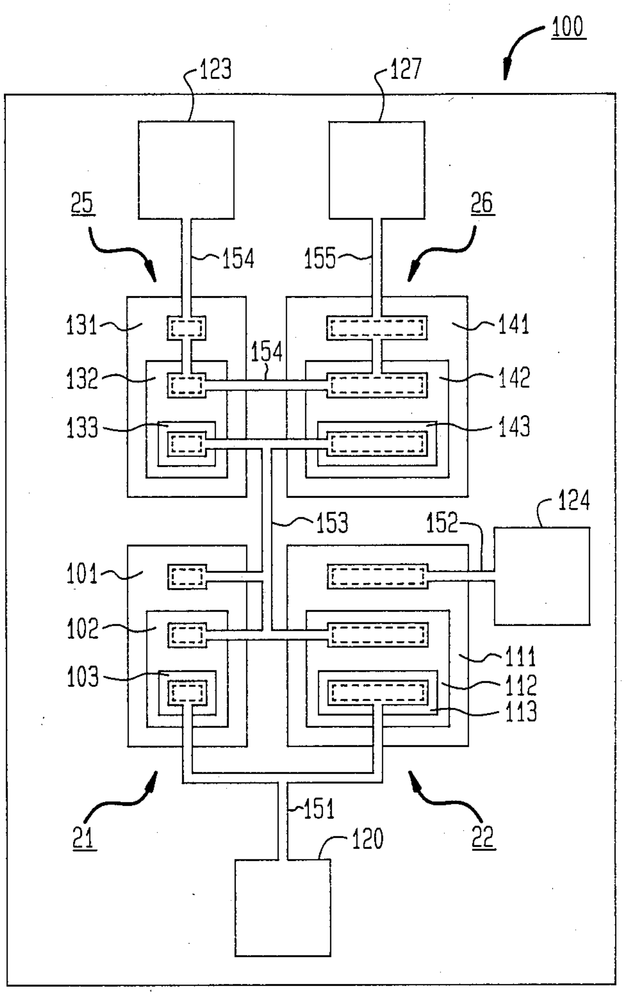
FIG. 4 is a top plan view of a semiconductor integrated circuit embodying the current mirror circuit of FIG. 3 on a semiconductor chip.

Such a current mirror circuit can be easily realized on a single semiconductor chip in the form of a semiconductor integrated circuit. One example of this semiconductor integrated circuit is shown in FIG. 4. In FIG. 4, the planar dimensions of the respective circuit elements are not coincident with the actual values for easier understanding.

An integrated circuit 100 is formed on a body comprising a P-type silicon substrate with impurity density of $5\times10^{15}$ cm$^{-3}$ and an N-type silicon epitaxial layer with impurity density of $10^{15}$–$10^{16}$ cm$^{-3}$ formed on the silicon substrate. The silicon epitaxial layer is converted to a P-type isolation region 150 with impurity density of $10^{19}$ cm$^{-3}$ by diffusing P-type impurities until they reach the silicon substrate, except for those portions which are used to form NPN transistors 21, 22, 25 and 26. The portions remained for forming the NPN transistors 21, 22, 25 and 26 operates as collector regions 101, 111, 131 and 141 of the respective transistors. P-type base regions 102, 112, 132 and 142 with impurity density of $5\times10^{18}$ cm$^{-3}$ are formed in the collector regions 101, 111, 131 and 141, respectively, through a single impurity diffusion process. Similarly, N-type emitter regions 103, 113, 133 and 143 with impurity density of $10^{20}$–$10^{21}$ cm$^{-3}$ are formed in the base regions 102, 112, 132 and 142, respectively, through another single impurity diffusion process. At this time, the emitter areas are so selected that the emitter regions 103, 133 become equal to each other and, when the area of these regions is assumed as "1". The emitter region 113 has "10" and the emitter region 143 has "9". The value of these ratios should be set less than "20" so as to avoid occurrence of the temperature gradient within each transistor during operation thereof and to prevent ununiformity of electric characteristics due to such temperature gradient. The absolute area of the each emitter should be set within $8000\mu^2$. The minimum emitter area necessary for effecting operation as a transistor is $400\mu^2$. This value is mainly resulted from the need of providing an allowance in alignment of various masks for use in the manufacturing processes.

An insulating film is coated on the substrate after all the impurity diffusions are carried out, and the necessary apertures are then bored in the insulating film for taking-out electrodes. Wiring layers are then applied through those appertures, thereby to constitute a predetermined circuit arrangement. A wiring layer 151 extended from a grounded terminal 120 is connected to the emitter region 103 of the transistor 21 and the emitter region 113 of the transistor 22. The base region 102 and the collector region 101 of the transistor 21 are short-circuited to each other by a wiring layer 153 which is further connected to the base region 112 of the transistor 22, the emitter region 133 of the transistor 25 and the emitter region 143 of the transistor 26. The collector region 111 of the transistor 22 is connected to the output terminal 124 by the wiring layer 152. The base region 132 and the collector region 131 of the transistor 25 are short-circuited to each other by a wiring layer 154 which is further connected to the base region 142 of the transistor 26 and the input terminal 123. The collector region 141 of the transistor 26 is connected to a terminal 127 by a wiring layer 155.

While the current mirror circuit in which an input current is amplified at a so large ratio can be practiced in many various application fields, one typical example is a control circuit for the number of rotations of motors. A large current is required for feeding to a motor, but it is preferred for a control circuit for controlling such a large current to be operated with a current as small as possible, because the power consumed in the control circuit becomes less and a semiconductor integrated circuit for the low power control circuit can be realized more easily. The current mirror circuit as shown in the above embodiment is advantageously utilized at the interface between the control circuit and the motor.

Figure 5:
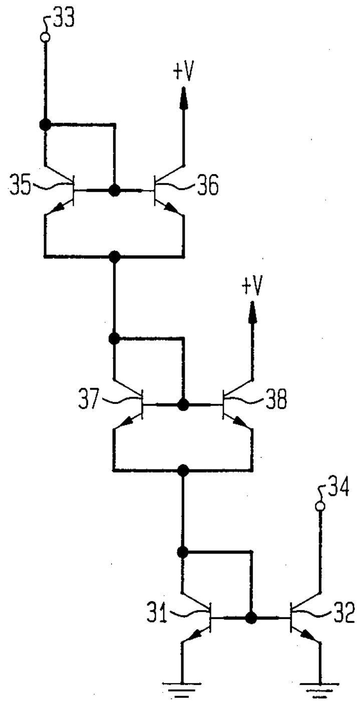
FIG. 5 is a circuit diagram of a current mirror circuit according to a second embodiment of the present invention.

A second embodiment according to the present invention is shown in FIG. 5 which permits a still larger ratio of an output current to an input current. This embodiment uses three partial current mirrors; a first partial current mirror comprising transistors 31 and 32, a second partial current mirror comprising transistors 37 and 38, and a third partial current mirror comprising transistors 35 and 36. An input terminal 33 is connected to base and collector of the transistor 35 for the third partial current mirror. Source voltage +V is applied to collector of the transistor 36. Emitters of both transistors 35 and 36 are connected to collector and base of the transistor 37 for the second partial current mirror. The source voltage +V is also applied to collector of the transistor 38. Emitters of both transistors 37 and 38 are connected to collector and emitter of the transistor 31 for the first partial current mirror. Collector of the transistor 32 is connected to an output terminal 34. Emitters of both transistors 31 and 32 are grounded together.

Now assuming that the ratio of emitter area of the transistor 32 to that of the transistor 31 is $N_{31}$, the ratio of emitter area of the transistor 38 to that of the transistor 37 is $N_{32}$, the ratio of emitter area of the transistor 36 to that of the transistor 35 is $N_{33}$, an input current applied to the input terminal 33 is $I_{33}$, and an output current taken out from the output terminal 34 is $I_{34}$, the following equation is obtained:

$$I_{34}/I_{33}=(1+N_{32})\cdot(1+N_{33})\cdot N_{31} \quad (14)$$

For example, by setting $N_{31}$ at "10" and $N_{32}$ and $N_{33}$ at "9":

$$I_{34}/I_{33}=(1+9)\cdot(1+9)\cdot 10=1000 \quad (15)$$

Thus, an output current 1,000 times larger than an input current is obtained. In this case, when the emitter area of the respective transistors 31, 35 and 37 are assumed to be equal one another and as "1", the total emitter area of all the transistors becomes "31". In the conventional circuit as shown in FIG. 1, the emitter area of the transistor 2 must be set 1,000 times larger than that of the transistor 1 in order to obtain an output current 1,000 times an input current. On the other hand, the present invention permits to obtain a current mirror circuit with an input/output current ratio of 1,000 using very small emitter area. It is a matter of course that, to make still larger the ratio of an output current to an input current, one or more partial current mirrors may be serially interposed between the input terminal and the base-collector common joint of the transistor 35 of the third partial current mirror.

Figure 6:
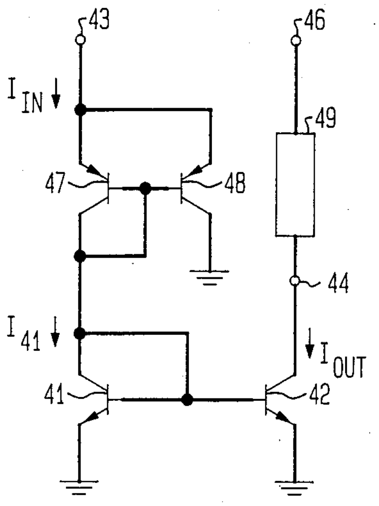
FIG. 6 is a circuit diagram of a current mirror circuit according to a third embodiment of the present invention.

FIG. 6 shows a third embodiment according to the present invention in which an amount of output current is reduced relative to that of input current. This embodiment is composed of a first partial current mirror comprising NPN transistors 41 and 42 and a second partial current mirror comprising PNP transistors 47 and 48. An input terminal 43 is connected to emitters of both transistors 47 and 48 for the second partial current mirror. Collector of the transistor 48 is grounded. Base and collector of the transistor 47 are short-circuited to each other to form a diode and then connected to the base-collector short-circuited joint of the transistor 41. The transistor 41 operates also as a diode by the base-collector short-circuit. Emitters of both transistors 41 and 42 are grounded together. Collector of the transistor 42 is connected to an output terminal 44. A load 49 is connected between the output terminal 44 and a voltage source terminal 46 so as to constitute an electronic circuit in combination with the current mirror circuit comprising the transistors 41, 42, 47 and 48.

The ratio of emitter area of the transistor 42 to that of the transistor 41 and the ratio of emitter area of the transistor 48 to that of the transistor 47 are both at 1/20 or more. Herein, the minimum emitter area required for each transistor is 400 $\mu m^2$ as previously noted. Therefore, when the emitter area of the transistor 42, 48 is assumed as "1" to the contrary with the foregoing first and second embodiments, the emitter area of the transistor 41, 47 is set less than "20", preferably "5–20". The maximum size of this emitter area is less than 8,000 $\mu m^2$ also as previously noted to prevent occurrence of the temperature gradient within the emitter regions.

Now assuming that the ratio of emitter area of the transistor 42 to that of the transistor 41 is 1/K, the ratio of emitter area of the transistor 48 to that of the transistor 47 is 1/M, an input current applied to the input terminal 43 in $I_{IN}$, an output current taken out from the output terminal 44 is $I_{OUT}$, and a current flowing between the base-collector short-circuited points of both transistors 41 and 47 is $I_{41}$, the following equations are obtained:

$$I_{OUT}/I_{41}=1/K \quad (16)$$

$$I_4/I_N=1/(1+M) \quad (17)$$

$$\therefore I_{OUT}/I_{IN}=1(K+K\cdot M) \quad (18)$$

Thus, by setting K and M both at 5–20, an output current can be set 1/30–1/420 times smaller than an input current. In this case, it is possible to make the total emitter area of all the transistors much smaller than that in case of using the circuit conception of the conventional circuit as shown in FIG. 1. Therefore, when the current mirror circuit of this embodiment is formed into a semiconductor integrated circuit, the occupied are becomes smaller and hence the cost of the semiconductor integrated circuit can be lowered. Further, since the circuit is formed of transistors with smaller emitter areas, the temperature gradient will not be occurred in the emitter region of each transistor, so that an output current reduced at a predetermined rate relative to an input current may be obtained stably. Moreover, the voltage required between the output terminal and the grounded terminal for normal operation of the current mirror circuit is just the collector-emitter saturated voltage of the transistor 42, i.e., 0.3 V. As a consequence, a range of voltage applied to the load for use in connection with the output terminal 44 becomes broad and hence the current mirror circuit of this embodiment has a wide range of application.

In this way, while the current mirror circuit in which an output current is reduced at a predetermined ratio relative to input current can be practiced in many various application fields, one typical example is a timer circuit. In the timer circuit, a capacitor is charged with a constant current and time is detected based on the charged voltage. A capacitor with smaller capacitor is more cheap. From this reason, the timer circuit can be manufactured at the lower cost by using a capacitor with smaller capacitor. Also, when such a timer circuit is formed into a semiconductor integrated circuit, a capacitor having a capacity as much as 100 pF is allowed to form on a semiconductor chip. To charge the capacitor with such very small capacity, there is required an extremely small constant current. The current mirror circuit of this embodiment can be advantageously used for producing such an extremely small constant current.

Figure 7:
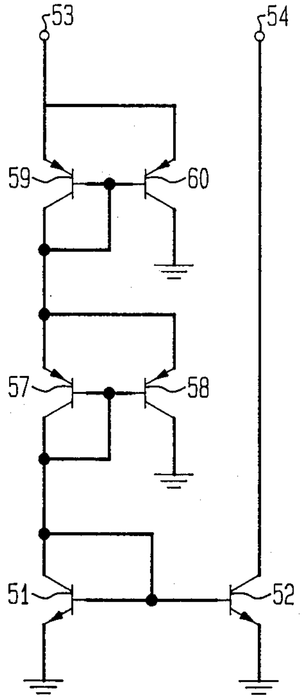
FIG. 7 is a circuit diagram of a current mirror circuit according to a fourth embodiment of the present invention.

FIG. 7 shows a fourth embodiment according to the present invention which permits reduction of an input current at still larger ratio. This embodiment is composed of a first partial current mirror comprising NPN transistors 51 and 52, a second partial current mirror comprising PNP transistors 57 and 58, and a third partial current mirror comprising PNP transistors 59 and 60. Emitters of the transistors 59 and 60 for the third partial current mirror are connected to an input terminal 53. Collector of the transistor 60 is grounded. Base and collector of the transistor 59 is short-circuited and then connected to emitters of the transistors 57 and 58. Collector of the transistor 58 is grounded. Base and collector of the transistor 57 is short-circuited and connected to a short-circuited point between base and collector of the transistor 51. Emitters of the transistors 51 and 52 for the first partial current mirror are grounded together. Collector of the transistor 52 is connected to an output terminal 54.

Therefore, an input current applied to the input terminal 53 is first reduced at a predetermined ratio through the partial current mirror and then applied to the second partial current mirror. The input current is further reduced at a predetermined ratio through the second partial current mirror and finally applied to the third partial current mirror. In the third current mirror, the twice reduced input current is further reduced at a predetermined ratio to produce an output from the output terminal. In this way, the output current becomes very small relative to the input current. Now assuming that the ratio of emitter area of the transistor 51 to that of the transistor 52 is 10, the ratio of emitter area of the transistor 57 to that of the transistor 58 is 1/9, and the ratio of emitter area of the transistor 59 to that of the transistor 60 is 1/9, the resultant output current becomes 1/1,000 of the input current. More particularly, assuming that the currents flowing through the transistors 51, 52, 57, 58, 59 and 60 are denoted by $I_{51}$, $I_{52}$, $I_{57}$, $I_{58}$, $I_{59}$ and $I_{60}$, respectively, the following equations are obtained:

$$I_{52}/I_{51}=1/10 \qquad (19)$$

$$_{58}/I_{57}=9 \qquad (20)$$

$$_{60}/I_{59}=9 \qquad (21)$$

The output current $I_{OUT}$ flowing through the output terminal 54 is the same as the current $I_{52}$, and the input current $I_{IN}$ supplied to the input terminal 53 is the sum of the currents $I_{59}$ and $I_{60}$. The current $I_{51}$ is equal to the current $I_{57}$, and the current $I_{59}$ is equal to the sum of the currents $I_{57}$ and $I_{58}$. Thus, the following equations are obtained:

$$I_{OUT}=I_{52} \qquad (22)$$

$$I_{IN}=I_{59}+I_{60} \qquad (23)$$

$$I_{51}=I_{57} \qquad (24)$$

$$I_{59}=I_{57}+I_{58} \qquad (25)$$

From equations (14) through (20), the ratio of the output current $I_{OUT}$ to the input current $I_{IN}$ substantially takes a value of $1/((1+9)\times(1+9)\times 10)=1/1000$.

On this occassion, when the emitter area of the smaller transistors in the respective partial current mirrors, i.e., the transistors 52, 57 and 59 is assumed as "1", the total emitter area of all the transistors becomes "31". Thus, if all the circuit of the third embodiment is formed in a semiconductor integrated circuit, the total emitter area for all the transistors 51, 52, 57, 58, 59 and 60 is very small as compared with the total emitter area of "1,001" resulted from the case where the current mirror circuit is formed into a semiconductor integrated circuit by using the circuit concept of the conventional circuit shown in FIG. 1. Also, since each transistor can be reduced in its size, the temperature gradient less occurs within each transistor and there can be obtained a current mirror circuit which permits to reduce an input current at a predetermined rate stably. In addition, since only one collector-emitter path of the transistor 52 is present between the ground potential and the output terminal 54, loads of wide range can be connected to the output terminal.

In order to make a still larger reduction ratio of an output current relative to an input current, one or more partial current mirrors each comprising a pair of PNP transistors may be additionally connected in series between the common joint of emitters of the transistors 59, 60 and the input terminal 53.

Although the present invention has been explained taken in conjunction with the limited embodiments, it will be apparent that the present invention is not limited to the foregoing embodiments. If the porality of the power source is reversed in the above embodiments, the porality of the transistors used in them may be reversed. Paired transistors constituting one partial current mirror in each embodiment can be formed of a single transistor of multicollector type. For example, a partial current mirror usable for the embodiments shown in FIGS. 3 and 5 can be formed as follows in the above case. In a semiconductor region of one conductivity type serving as base there are formed three regions of the other conductivity type, one of which is used as an emitter and the remaining two of which are used as first and second collectors. One of the first and second collectors is made to have a larger area than the other collector and the other is short-circuited to the semiconductor region serving as base. And this short-circuited point is used as an input terminal, the collector not short-circuited is used as an output terminal, and the emitter is used as a common terminal or reference potential terminal. It is needless to say that, the similar multicollector type transistor is equally applicable to the partial current mirror usable for the embodiments shown in FIGS. 6 and 7 with some adequate circuit arrangement.

What is claimed is:

1. A current mirror circuit comprising:

an input terminal;

a first transistor of one polarity having an emitter connected to said input terminal, a base and a collector;

means for forming a conductive path between the base and collector of said first transistor;

a reference terminal;

a second transistor of said one polarity having an emitter connected to the emitter of said first transistor, a base connected to the base of said first transistor and a collector connected to said reference terminal;

a third transistor of said one polarity having an emitter connected to the collector of said first transistor, a base and a collector;

means for forming a conductive path between the base and collector of said third transistor;

a fourth transistor of said one polarity having an emitter connected to the emitter of said third transistor, a base connected to the base of said third transistor and a collector connected to said reference terminal;

a fifth transistor of the other polarity having an emitter connected to said reference terminal, a base and a collector connected to the collector of said third transistor;

means for forming a conductive path between the base and collector of said fifth transistor;

an output terminal;

and a sixth transistor of said other polarity having an emitter connected to said reference terminal, a base connected to the base of said fifth transistor and a collector connected to said output terminal;

said second transistor having an emitter area larger than an emitter area of said first transistor;

said fourth transistor having an emitter area larger than an emitter area of said third transistor;

said sixth transistor having an emitter area smaller than an emitter area of said fifth transistor;

whereby an output current is provided at said output terminal which is smaller than an input current supplied to said input terminal.

2. The current mirror circuit as claimed in claim 1, wherein said first, second, third and fourth transistors are of a PNP type and said fifth and sixth transistors are of an NPN type, said reference terminal being a ground terminal.

* * * * *